United States Patent
Wang et al.

(10) Patent No.: US 8,822,234 B2
(45) Date of Patent: Sep. 2, 2014

(54) METHOD OF FABRICATING A SEMICONDUCTOR DEVICE

(71) Applicant: Semiconductor Manufacturing International (Shanghai) Corporation, Shanghai (CN)

(72) Inventors: Xinpeng Wang, Shanghai (CN); Haiyang Zhang, Shanghai (CN)

(73) Assignees: Semiconductor Manufacturing International (Shanghai) Corporation; Semiconductor Manufacturing International (Beijing) Corporation (CN)

( * ) Notice: Subject to any disclaimer, the term of this patent is extended or adjusted under 35 U.S.C. 154(b) by 60 days.

(21) Appl. No.: 13/722,072

(22) Filed: Dec. 20, 2012

(65) Prior Publication Data
US 2013/0171742 A1   Jul. 4, 2013

(30) Foreign Application Priority Data
Dec. 30, 2011   (CN) .......................... 2011 1 0453192

(51) Int. Cl.
  *H01L 21/00*   (2006.01)
  *H01L 21/265*  (2006.01)
  *H01L 21/425*  (2006.01)
  *H01L 21/4763* (2006.01)
  *H01L 43/12*   (2006.01)

(52) U.S. Cl.
  CPC ...................................... *H01L 43/12* (2013.01)
  USPC ................ 438/3; 438/98; 438/523; 438/533; 438/622; 257/E21.001; 257/E21.208; 257/E21.436; 257/E21.663; 257/E21.665

(58) Field of Classification Search
  CPC ........ H01L 43/08; H01L 27/222; H01L 43/00
  See application file for complete search history.

(56) References Cited

U.S. PATENT DOCUMENTS

| | | | |
|---|---|---|---|
| 2008/0232003 A1* | 9/2008 | Ibusuki et al. | 360/324.11 |
| 2009/0130779 A1* | 5/2009 | Li et al. | 438/3 |
| 2010/0240189 A1* | 9/2010 | Jeong et al. | 438/385 |
| 2011/0129946 A1  | 6/2011 | Zhong et al. | |
| 2013/0037894 A1* | 2/2013 | Chung | 257/421 |

* cited by examiner

*Primary Examiner* — Mohsen Ahmadi
(74) *Attorney, Agent, or Firm* — Innovation Counsel LLP

(57) ABSTRACT

A method of fabricating a miniaturized semiconductor device so as to form MTJ elements therein include the steps of depositing a magnetic tunnel junction (MTJ) precursor layer on a substrate and planarizing the precursor layer; forming a sacrificial and patternable dielectric layer on the MTJ precursor layer; patterning the sacrificial dielectric layer in accordance with predetermined placements and shapes of a to-be-formed hard mask, the patterning forming corresponding openings in the sacrificial dielectric layer; depositing an etch-resistant conductive material such as Cu in the openings for example by way of plating, and selectively removing the sacrificial dielectric layer so as to leave behind the etch-resistant conductive material in the form of a desired hard mask. Using the hard mask to etch and thus pattern the MTJ precursor layer so as to form MTJ elements having desired locations, sizes and shapes.

20 Claims, 9 Drawing Sheets

METHOD OF FABRICATING A SEMICONDUCTOR DEVICE

CROSS-REFERENCE TO RELATED APPLICATIONS

This application claims to Chinese Patent Application No. CN201110453192.8, filed on Dec. 30, 2011 and entitled "Method of fabricating a semiconductor device", which application is incorporated herein by reference in its entirety.

BACKGROUND

1. Field of Disclosure

The present disclosure of invention relates to the field of semiconductor device fabrication, and more specifically, to a method of forming magnetic tunnel junction (MTJ) structures.

2. Description of the Related Technology

With function densities (e.g., memory densities) in semiconductor devices tending to become higher and higher, it has been proposed that magneto resistive random access memories (MRAMs) which utilize magnetic tunnel junction (MTJ) structures as their elemental storage unit be used for next generation semiconductor memories. Such MRAMs promise to provide many advantages, for example in terms of greater write/read speeds, lower power consumption and longer device lifetime. In the elemental MTJ storage units (storage elements), a magneto-resistance ratio varies according to the respective magnetization directions of two respective ferromagnetic layers. A determination as to whether a logic "1" or logic "0" is being stored in the MTJ element can be made by measuring a change in voltage or in current of a sensing signal where this change is due to the magneto-resistance ratio variation.

The MTJ elements can have very small sized structures. More specifically, and as described for example in U.S. Patent Publication No. 2011/0129946 A1 (Zhong et al., "High density spin-transfer torque MRAM process") where said early publication is incorporated herein by reference, the MTJ element typically has a critical dimension that is less than 100 nm and typically has a thickness of less than 5 nm. Therefore, when mass production of devices containing such small MTJ element is considered, it becomes a problem as to how to accurately control MTJ dimensions within the context of a semiconductor device fabrication, especially if it is desired to further decrease MTJ sizes in the near future.

Referring to FIG. 1 sake of background, illustrated there is a semiconductor device structure containing MTJ elements which are formed in accordance with a method disclosed in the above-cited U.S. Patent Publication No. 2011/0129946 A1. In the method, and as a foundational start, so-called, metal landing pads 11 made of Cu are formed in a substrate and then intermediate via contacts (VAC) 21 also made of Cu are formed. Next, a metal separation (VAM) dielectric layer 14a and via-covering VAM pads 31p are formed thereon. Then, a MTJ stack is blanket formed on the metal separation (VAM) dielectric layer 14a and on the VAM pads 31p. After that, selective etching is performed using a hard mask disposed on the MTJ stack's top layer to thereby form the illustrated MTJ elements 51. Finally, a chemical mechanical planarization (CMP) process is performed on the resulting structure containing the formed MTJ elements 51 for further forming connection lines 91 made of Cu.

However, in the process disclosed by US 2011/0129946, the hard mask consists of Ta, and the use of such a Ta based hard mask can result in etching loss. More specifically, during the etch process, a small portion of the sidewalls and the upper corners of the hard mask layer tend to become etched out, thus altering the pattern defined by the hard mask as the etch process proceeds. Therefore, it becomes difficult if not impossible to provide an exact pattern transfer to the MTJ element 51. Additionally, if a planarizing CMP is performed after the MTJ elements 51 are formed by the Ta based etch process, the post-etch CMP may cause damage to the very thin MTJ elements and degrade performance or render the device inoperable.

In view of this, there is a need for a different method of forming MTJ elements where the alternative method is capable of more precisely defining MTJ element sizes while preventing MTJ elements from being damaged by a post etch planarization process.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a way to eliminate or at least partly alleviate some or all of the above described problems.

In accordance with the present disclosure, a method of forming MTJ elements is provided in which a predetermined MTJ pattern is formed using a mask made of a metal (such as Cu) that is substantially insusceptible to the etching process. The method is carried out such that it is not necessary to planarize the MTJ elements post etch. Accordingly, MTJ elements with precise size definitions and having no planarization damage can be fabricated in a mass production setting.

In accordance with one aspect of the present disclosure, there is provided a method of fabricating a miniaturized semiconductor device, comprising: forming in recesses of a provided semiconductor or other substrate, a plurality of landing pads and a plurality of connection pads respectively in a memory device region of and in a non-memory device region of the substrate; blanket forming a magnetic tunnel junction precursor layer of uniform thickness on the substrate having the plurality of landing pads and the plurality of connection pads; depositing a consumed (sacrificial) dielectric layer on the magnetic tunnel junction precursor layer; forming a plurality of openings in the consumed dielectric layer, each of which corresponds to a respective one of the plurality of landing pads; depositing a metal mask layer in the plurality of openings for example by way of a plating process; selectively removing the consumed dielectric layer; and etching the magnetic tunnel junction precursor layer using the metal mask layer as a hard mask to thereby form a plurality of magnetic tunnel junction elements.

Further aspects and features of the present disclosure of invention and advantages thereof will become apparent from the following detailed description and attached drawings.

BRIEF DESCRIPTION OF THE DRAWINGS

The accompanying drawings, which are incorporated in and thus constitute part of the specification, illustrate embodiments in accordance with the present disclosure and, together with the textual description, serve to explain the principles of the present teachings.

With reference to the accompanying drawings, this disclosure can be understood more clearly from the following detailed description, in which.

DESCRIPTION OF THE EMBODIMENTS

Figure 1:
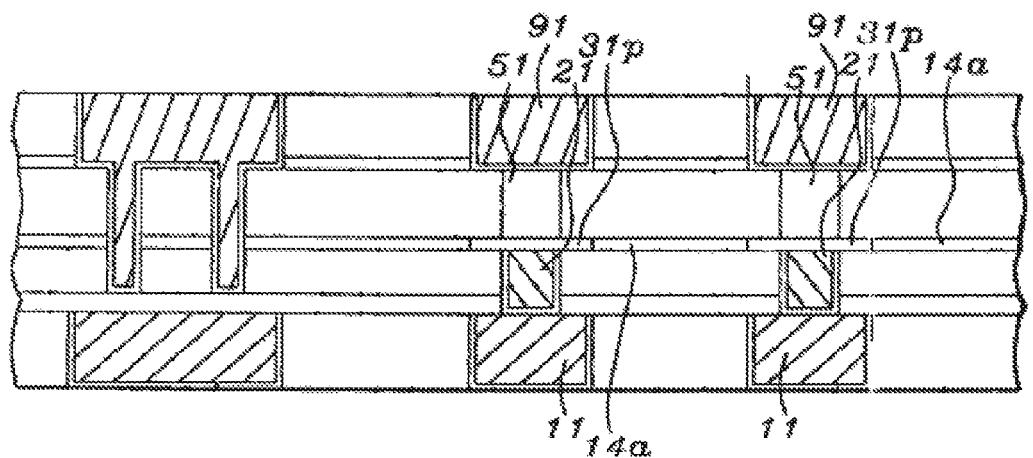
FIG. 1 shows a device having magnetic tunnel junction (MJT) elements formed in accordance with a prior art fabrication process.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless specifically stated otherwise.

Meanwhile, it should be appreciated that, for the convenience of description, various parts in the accompanying drawings are not necessarily drawn to practical scales.

The following description of at least one exemplary embodiment is merely illustrative in nature and is in no way intended to limit the present teachings, their application, or uses.

Various well known techniques, methods and apparatus as known by one of ordinary skill in the relevant art may not be discussed in detail here but are to be considered to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In order to obtain MTJ elements having substantially precise sizes and having basically no damage thereto due to planarization and due to dry etching during mass production processes, the present disclosure provides a novel method of forming MTJ elements. More specifically, and in brief, after an MTJ stack (308, see FIG. 3D) is formed on a base substrate 300 and a so-called, consumed dielectric layer 309 is patterned (see FIG. 3E), a metal layer that is usable also for forming connection lines (interconnect lines), for example a Cu-based layer, is formed in recesses of the consumed (sacrificial) dielectric layer 309, and then this metal layer which is substantially insusceptible to an etching process applied to the MTJ stack (308) is utilized as a patterned mask to selectively and similarly pattern the MTJ stack layer beneath it see (FIG. 3H).

Figure 2:
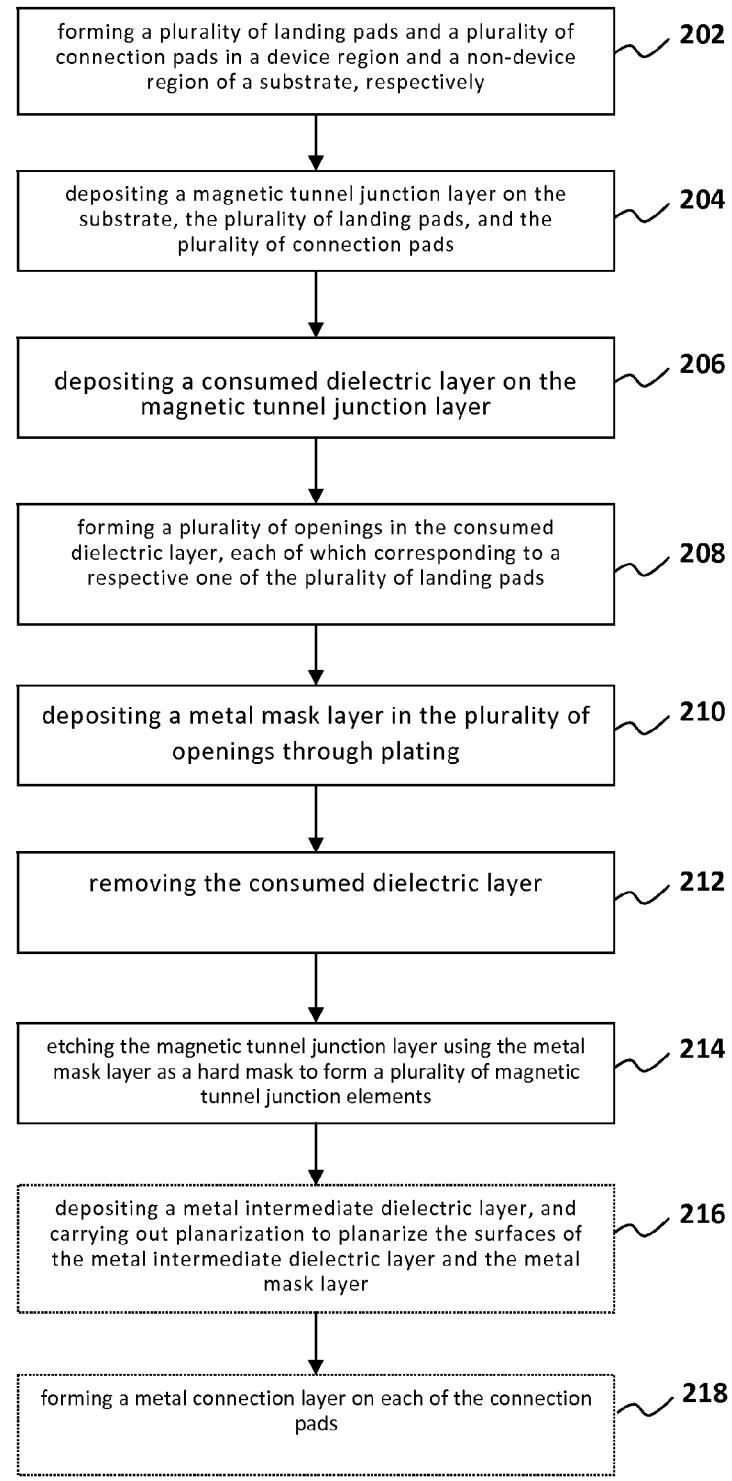
FIG. 2 is a flow chart showing a method of forming tunnel junction elements according to one embodiment of this disclosure.

Referring to the flow chart of FIG. 2, it schematically shows a method of forming magnetic tunnel junction elements according to one embodiment of this disclosure. FIGS. 3A to 3L schematically illustrate sectional views of structures obtained in various steps of the method of FIG. 2. In the below, the steps and embodiments will be described in detail with reference to FIG. 2 and corresponding ones of FIGS. 3A to 3L.

Figure 3A:
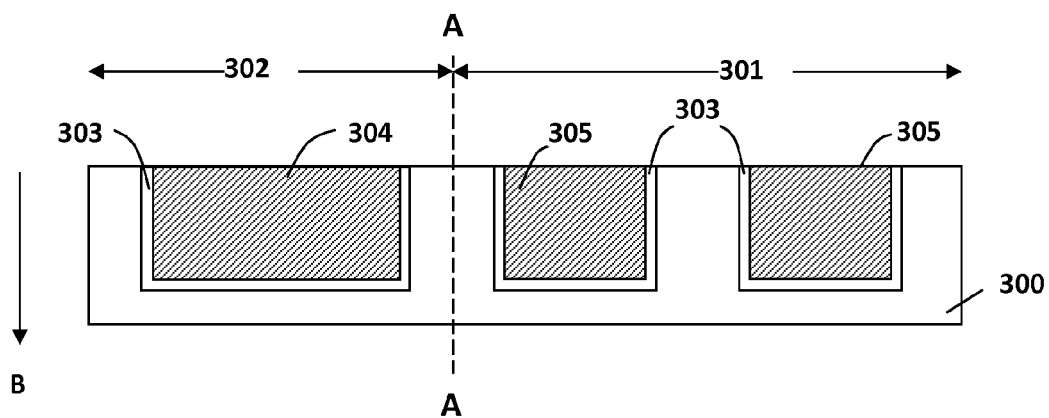
FIGS. 3A to 3L schematically illustrate cross sectional views of structures obtained in various steps of the method of forming tunnel junction elements as shown in FIG. 2.
Figure 3B:
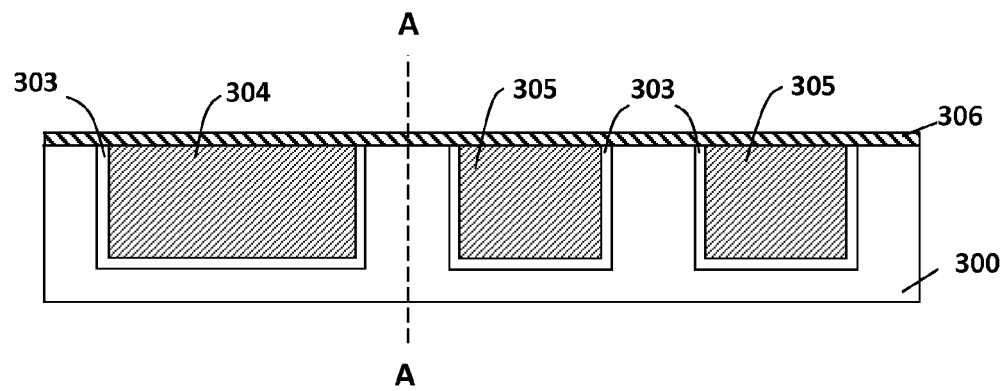

In a first step 202 of FIG. 2, a substrate 300 (e.g., one composed in bulk of a semiconductor such as silicon) is provided, and a plurality of recesses (wells, grooves, etc.) of predetermined top plan view shapes are formed therein and coated on their sidewalls and bottoms with a barrier material (303, see FIG. 3A). Then, so-called, landing pads 305 for the MTJ elements (not yet shown) are formed in some of the coated recesses while a plurality of so-called, connection pads 304 are formed in others of the recesses of the substrate 300 (see FIG. 3A). Alternatively or additionally to being composed in bulk of a semiconductor (e.g., Si), the substrate 300 may be made of, for example, of a low dielectric constant material having a dielectric constant of about 2.5~3.0 or of a super low dielectric constant material having a dielectric constant less than 2.5. For example, substrate 300 is made of a silicon oxide (SiOx).

As indicated by the dashed dividing line A-A in FIG. 3A, substrate 300 can be viewed as being divided into a memory device containing region 301 and a non-memory device region 302. Note that device region 301 and non-device region 302 as well as the boundary line A-A therebetween in FIG. 3A are merely conceptual and only shown for illustration. In more practical devices, there may be many memory device regions 301 and non-device regions 302 with various shapes (as seen in a top-to-down plan view, such as, indicated by the arrow B in FIG. 3A) and various functionalities.

Therefore, for the illustrative case of FIG. 3A, a plurality of landing pads 305 are formed in device region 301 and a plurality of connection pads 304 are formed in non-device region 302, where for sake of simplicity, merely one connection pad 304 and two landing pads 305 are shown. Those skilled in the art may understand that an additional one or more connection pads 304 and an additional one or more landing pads 305 can be formed. Further, it is to be understood that each landing pad 305 corresponds to one magnetic tunnel junction (MTJ) element formed in a subsequent process.

Generally, connection pads 304 and landing pads 305 are made predominantly of Cu. Preferably, first a diffusion barrier layer 303 is formed on the bottom and sidewalls of each of each recess of the respective landing pads 305 and connection pads 304 to thereby effectively prevent undesired metal diffusion (of copper) to adjacent parts of the substrate 300. For example, at first, a plurality of pad openings (or recesses, grooves or wells, not shown alone) may be formed in substrate 300. After that first diffusion barrier layer 303 is formed on the bottom wall and sidewalls of each of the pad openings. Then, the landing pads 305 and connection pads 304 are formed in the wells coated by the first diffusion barrier layer 303 for example through a selective plating process. Those skilled in the art may appreciate that landing pads 305 and connection pads 304 may also be formed through other well known techniques in the art.

After landing pads 305 and connection pads 304 are formed in substrate 300, then preferably a planarization process is carried out, such as chemical mechanical planarization (CMP), to planarize the top surfaces of the deposited plurality of landing pads 305 and the plurality of connection pads 304, and make them coplanar with the top surface of the substrate 300.

Next, at step S204 of FIG. 2, a magnetic tunnel junction stack layer (308 in FIG. 3D, also referred to here as a magnetic tunnel junction precursor layer whose individualized ferromagnetic and anti-ferromagnetic layers are not shown) is deposited on substrate 300 having the landing pads 305 and connection pads 304 formed therein. In one embodiment, and as shown in more detail in FIG. 3B, first, a conductive and diffusion-blocking, separation layer 306 is deposited on substrate 300. Then, a photoresist layer (not shown) is coated on the separation layer 306, patterned, and used to form separation islands (not shown) individually covering each of the plurality of landing pads 305. In one embodiment, a reactive ion etching (RIE) process is performed to form the individualized separation parts 306a which are shaped as separation islands, as shown in FIG. 3C.

Separation parts 306a can be used as diffusion barrier layers to effectively prevent metal diffusion (e.g., Cu out diffusion) from landing pads 305 to the to be formed MTJ elements which are going to be formed on separation parts 306a in a subsequent process. Separation layer 306 may be made of any one or more of Ta, TaN or other conductive and diffusion blocking materials. Separation layer 306 is preferably thin, for example, it has a thickness in a range from 10 nm to 50 nm.

Figure 3C:
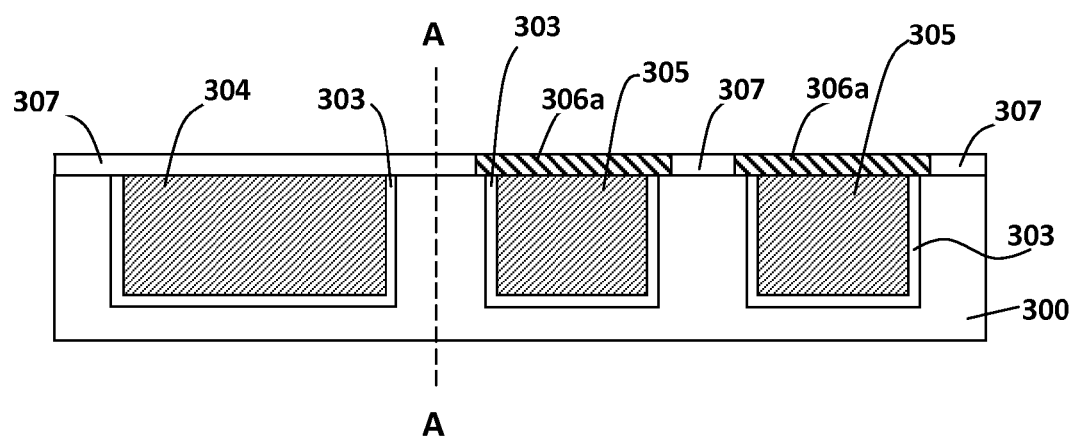

Then, a gaps-filling separation dielectric layer 307 is deposited on separation parts 306a and exposed parts of the substrate 300 and of the connection pads 304 as shown in FIG. 3C. In one embodiment, separation dielectric layer 307 may include a same material as that of substrate 300 (e.g., SiOx). In another embodiment, separation dielectric layer 307 may include a material different to that of substrate 300 (e.g., SiN, SiOxNy). Then, a planarization process, such as chemical mechanical planarization is performed, to planarize the surfaces of separation parts 306a and separation dielectric layer 307 to a same level so that their top surfaces are coplanar.

Figure 3D:
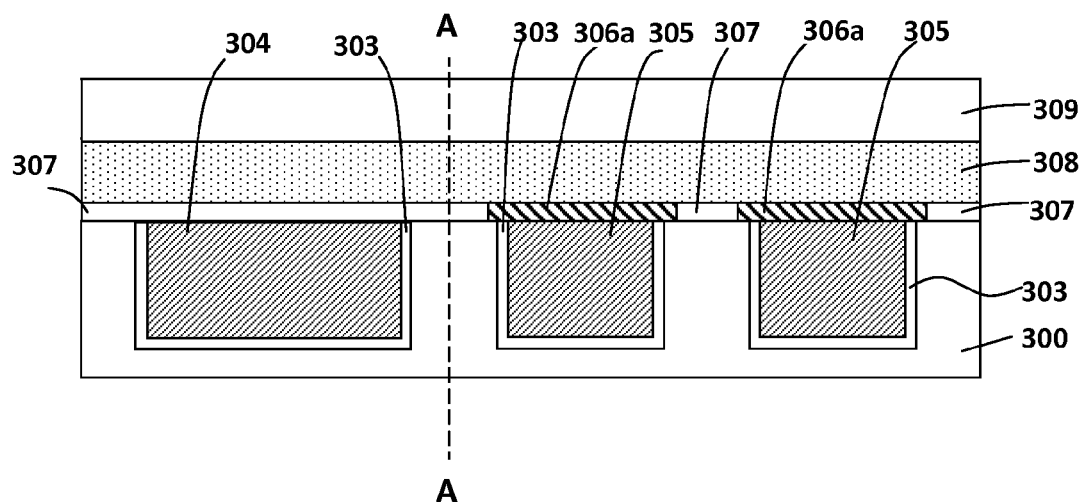

Finally, the magnetic tunnel junction stack layer 308 is deposited on the coplanar tops of the separation parts 306a and the separation dielectric layer 307, as shown in FIG. 3D. Note that although in the example shown in FIGS. 3B-3D, separation parts 306a are formed between landing pads 305 and MTJ layer 308, the conductive separation parts 306a are optional. In other embodiments, MTJ layer 308 can be deposited directly on substrate 300 after landing pads 305 and connection pads 304 are planarized. MTJ layer 308 can be made of cobalt-iron, nickel-iron and/or other ferromagnetic materials. In one embodiment, MTJ layer 308 is 1 nm~100 nm thick.

In step 206 of FIG. 2, a consumed (sacrificial) dielectric layer 309 is deposited on magnetic tunnel junction layer 308 as shown in FIG. 3D. The consumed dielectric layer 309 may be composed, for example, of a Si rich and Si-bottomed anti-reflective coating (Si-BARC), wherein Si content exceeds 30% volume. In another embodiment, consumed dielectric layer 309 is made of amorphous carbon.

Figure 3E:
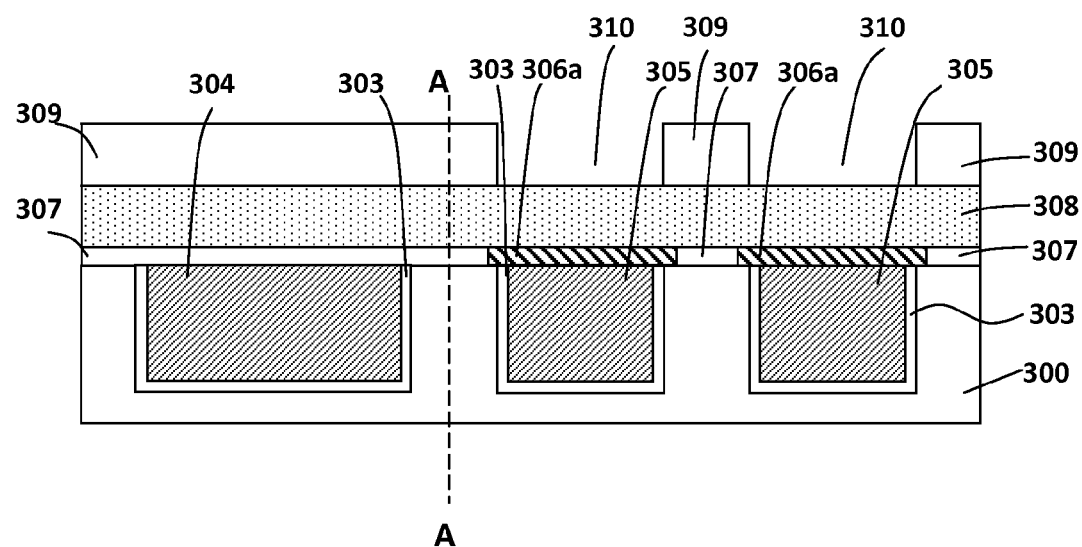

Next, at step 208 of FIG. 2, a plurality of openings 310, patterned to correspond to the positions of the landing pads 305, are formed in the consumed dielectric layer 309, with each opening 310 respectively corresponding to a respective landing pad 305, as shown in FIG. 3E. The cross sectional widths of the respective openings 310 coincide with the respective designed sizes of the to-be-formed magnetic tunnel junction elements. The patterns of the opening 310 may be, from a top-down plan view, those of a circle, an elliptical, or a rectangular shape for example.

Openings 310 can be obtained through the following process: coating a photoresist (PR) layer on consumed dielectric layer 309; patterning the photoresist layer to form a plurality of photoresist openings (not shown) each of which corresponds to a respective one of the plurality of landing pads 305; and performing a reactive ion etching (RIE) process to form a plurality of openings 310 in consumed dielectric layer 309 corresponding to the plurality of photoresist openings.

Figure 3F:
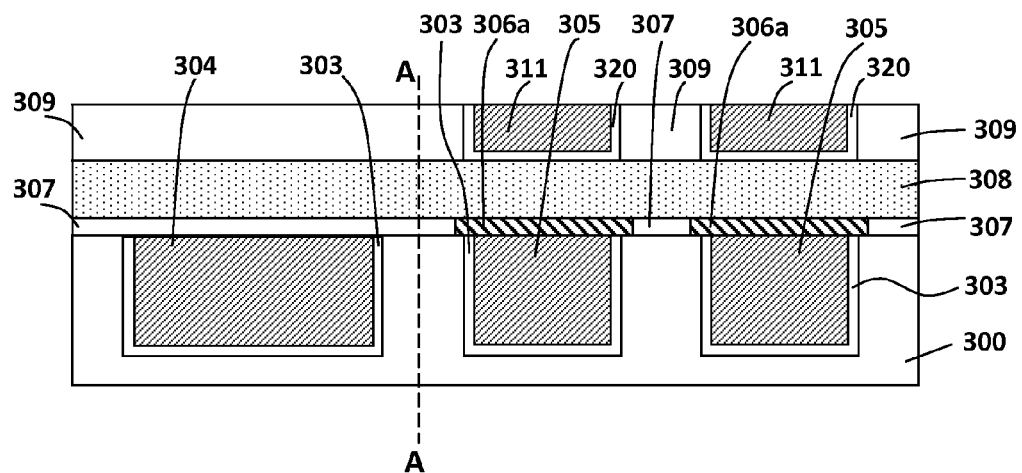

Then, at step 210 of FIG. 2, by using a damascene patterning technique, a mask layer 311 made of an approximate metal (such as Cu) that is substantially insusceptible to a to-be-subsequently used etching process is deposited in the plurality of openings 310 for example through plating, as shown in FIG. 3F. In one embodiment, before the masking metal is deposited, a second diffusion barrier layer 320 is formed on the bottom and sidewalls of each of the plurality of openings 310; then a metal mask seed layer (not shown) is grown on second diffusion barrier layer 320; and finally, the bulk Cu is deposited on the metal mask seed layer through plating to form the metal mask layer 311 having the pattern defined by the openings 310 made in the sacrificial (consumable) dielectric layer 309. The second diffusion barrier layer 320 is made of a material that can effectively prevent metal diffusion from metal mask layer 311 to the underlying MTJ layer. Preferably, after metal mask layer 311 is formed, a planarization process such as CMP is performed to planarize the top surfaces of metal mask layer 311 and consumed dielectric layer 309 so they are coplanar. In one embodiment, metal mask layer 311 is 10 nm to 100 nm thick after planarization.

Figure 3G:
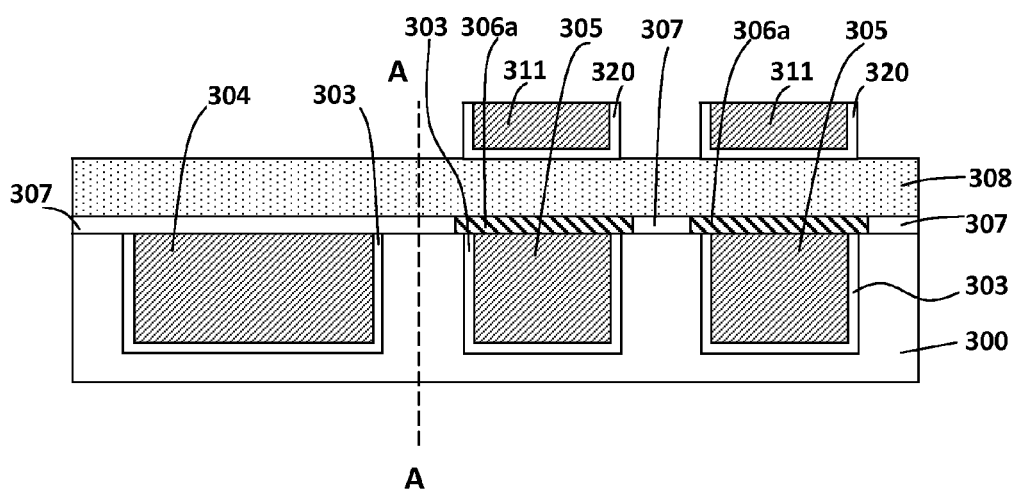
Figure 3H:
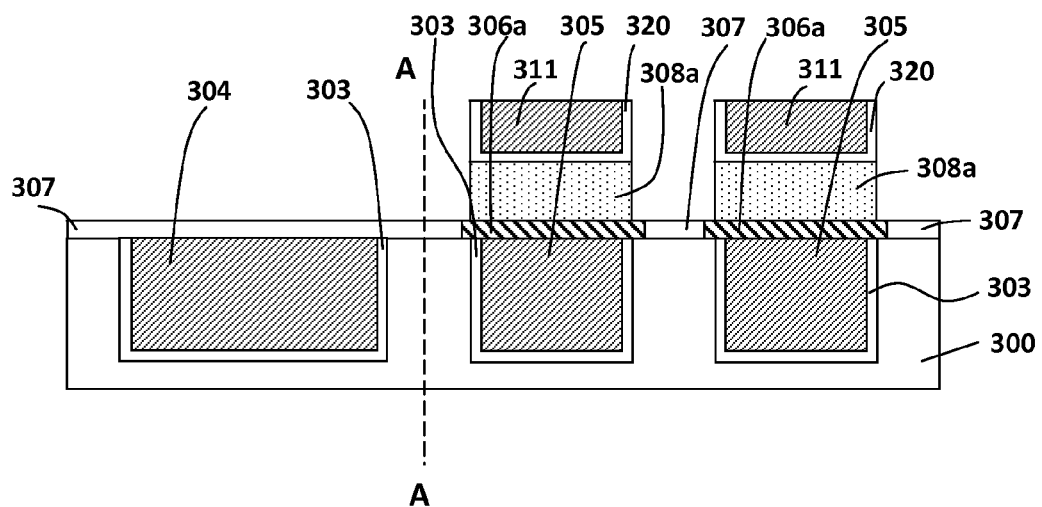

At step 212 of FIG. 2, consumed dielectric layer 309 is selectively removed, for example through a wet etching process or a combination of wet etching and selective ashing (e.g., with oxygen), while metal mask layer 311 remains, as shown in FIG. 3G. The wet etching process employs, for example, an etchant containing $H_2O_2$.

After that, at step 214 of FIG. 2, metal mask layer 311 and second diffusion barrier layer 320 are used as a hard mask to selectively etch and thus pattern the magnetic tunnel junction layer 308, so as to form a plurality of magnetic tunnel junction elements 308a, as shown in FIG. 3H. The respective patterns of the etched magnetic tunnel junction elements 308a may be, from a top-down plan view, one of a circle, an ellipse, a rectangle, another polygon or yet another shape as predetermined by the design of the MTJ element s. Magnetic tunnel junction elements 308a have respective cross-sectional widths not exceeding the corresponding cross-sectional widths of the features formed by the patterned metal mask layer 311 and second diffusion barrier layer 320 provided thereon (on the sidewalls).

As described above, metal mask layer 311 is made of a metal that is substantially insusceptible to the etching process applied to the magnetic tunnel junction layer 308, where the insusceptible metal can be predominantly composed for example of Cu. Therefore, in the process of etching the magnetic tunnel junction layer 308, the pattern of metal mask structure including layer 311 and second diffusion barrier layer 320 is essentially preserved and can therefore be accurately transferred to define the magnetic tunnel junction element 308a. Accordingly, further reducing the size of magnetic tunnel junction elements in a mass production environment no longer presents reliability and accuracy challenges. In addition, after magnetic tunnel junction elements 308a are obtained, no additional planarization process is needed for application to the top surfaces of the now-reduced in size and thus delicate MTJ elements, thus avoiding the danger of damage to the delicate magnetic tunnel junction elements 308a that might be caused by application of planarization process to the patterned MTJ elements.

Figure 3I:
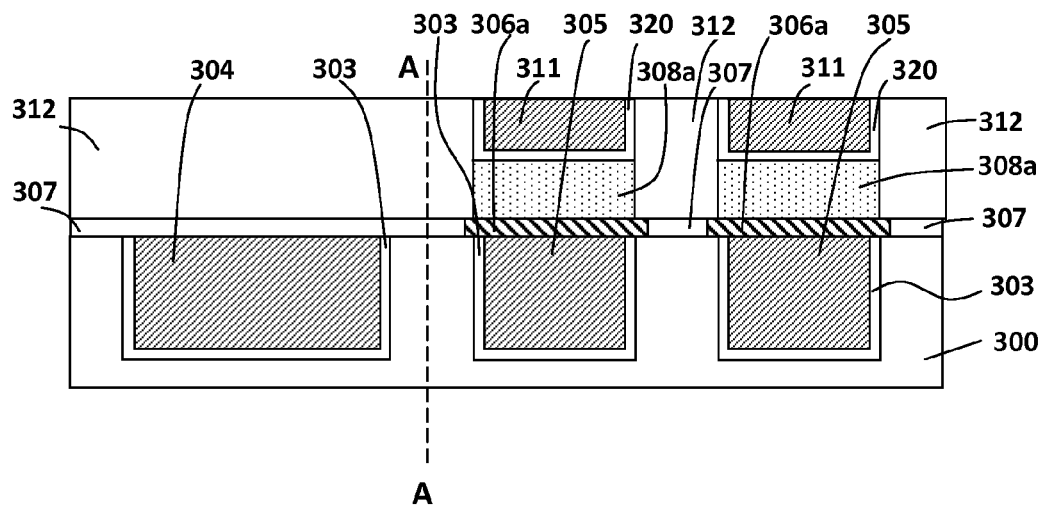

Then, at step 216 of FIG. 2, an intermediate dielectric layer 312 is deposited on the resulting structure and is planarized to the point of fully exposing a top surface of metal mask layer 311 as being coplanar with the top surface of intermediate dielectric layer 312, as is shown in FIG. 3I. In one embodiment, intermediate dielectric layer 312 may be made of a silicon oxide (SiOx), and/or a low dielectric constant material having a dielectric constant of 2.7~3.0, or a super low dielectric constant material having a dielectric constant of less than 2.7. In one embodiment, intermediate dielectric layer 312 may have a same material as that of substrate 300. In another embodiment, intermediate dielectric layer 312 may consist of a material different to that of substrate 300 (e.g., SiOxNy).

Figure 3J:
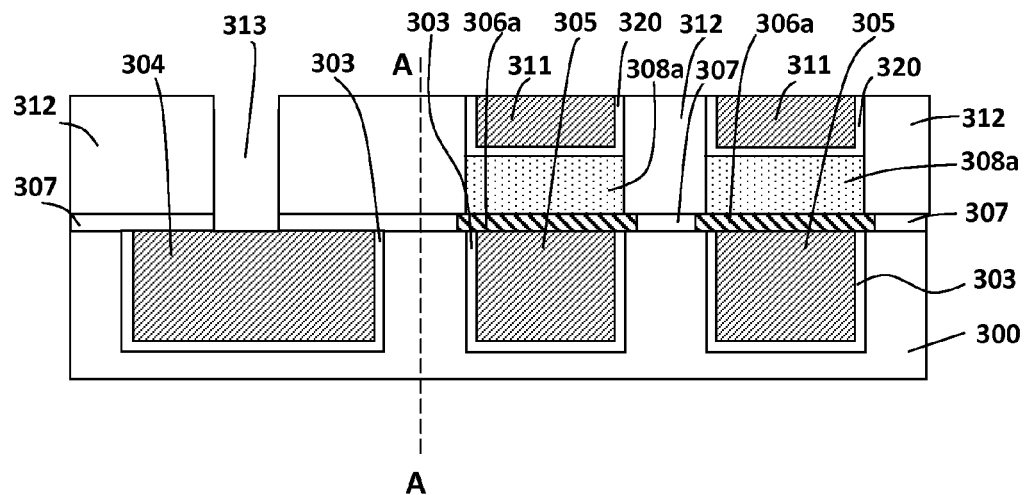
Figure 3K:
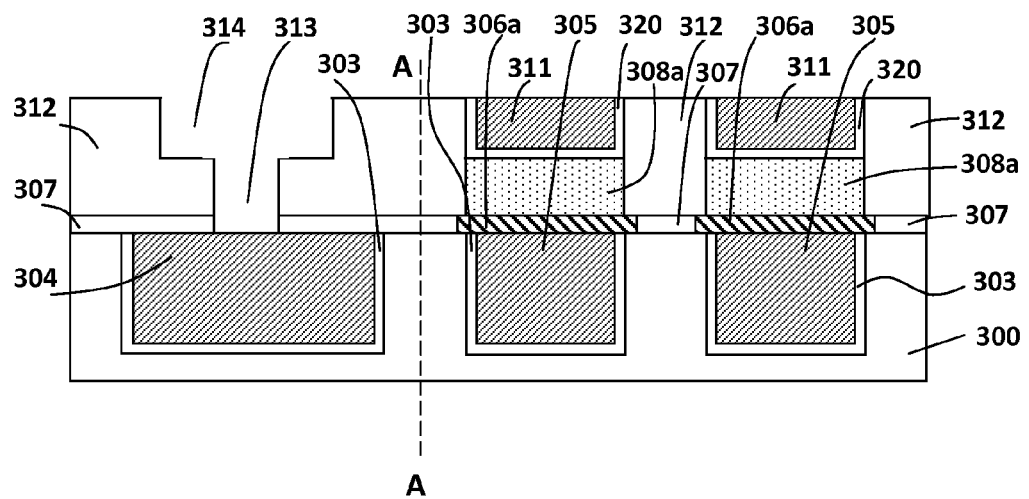

Finally, at step 218 of FIG. 2, through use of a dual damascene process, a metal connection layer 315 is formed directly on and electrical connection with connection pads 304. With reference to FIG. 3J, in one embodiment, a via such as the illustrated 313 is formed through the intermediate dielectric layer 312 and through the separation dielectric layer 307 so as to communicate with and expose a corresponding and underlying connection pad 304. Although only one via 313 is shown for a single connection pad 304 in FIG. 3J for sake of simplicity, in some embodiments, two or more vias 313 can instead be formed for each connection pad 304. Next, an etching process is carried out to form a wider trench 314 connected to the via 313 and formed in the intermediate dielectric layer 312, as shown in FIG. 3K. In one embodiment, the depth of trench 314 is substantially the same as the thickness of metal mask layer 311.

Figure 3L:
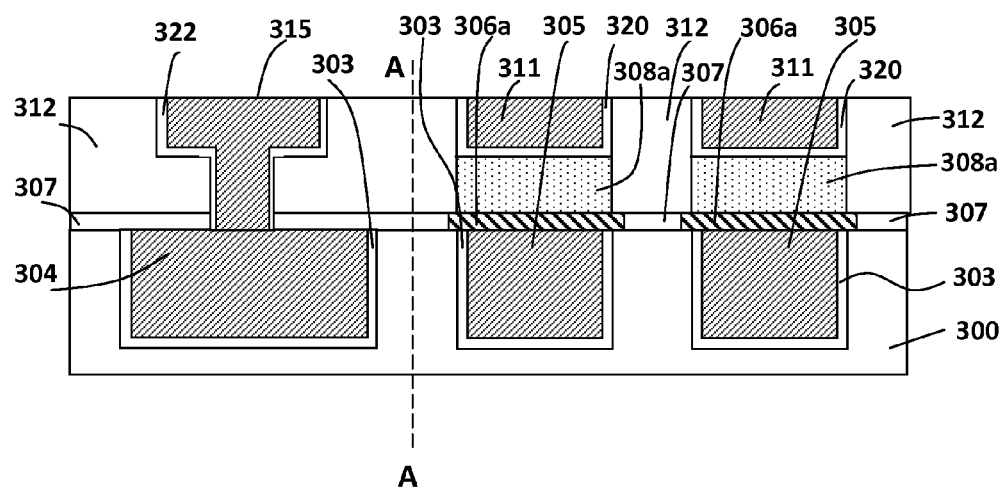

Next, with reference to FIG. 3L, a third diffusion barrier layer 322 is formed on the sidewalls of via 313 and of trench 314 (and optionally at the bottom of via 313), and a metal connection layer 315 made for example of Cu, W, or Al, is deposited over the top surface, to fill the via 313 and the trench 314. This is followed by a planarization process to form the co-planarized top surfaces of metal connection layer 315, intermediate dielectric layer 312 and metal mask layer 311. In some embodiments according to this disclosure, connection lines (such as, made of Cu) may be connected to metal mask layer 311 and extended along the direction perpendicular to the plane of the drawing (FIG. 3L) through, for example, the same dual damascene process.

Accordingly, in a method of forming MTJ elements according to the embodiments of this disclosure, a metal layer that is also usable for defining interconnect lines (connection lines, for example, Cu based ones) is also utilized as a mask to pattern the MTJ stack and define the corresponding and relatively small MTJ elements in a manner that, on one hand, allows the MTJ elements' small size can be precisely defined because the utilized metal mask is predominantly composed of a metal (e.g., Cu) that is substantially insusceptible to being removed by the etching process used to pattern the MTJ stack layer. On the other hand, after the delicate MTJ elements are formed; because their top surfaces are pre-planarized, a post-etch planarization process can be omitted, thus reducing damages.

In one embodiment method of forming MTJ elements according to the present disclosure, the usage of dry etching is reduced as much as possible, to thereby protect the top surfaces of the MTJ elements from being damaged, for example by continuous plasma bombardment such as may be present during reactive ion (RIE) or other such dry etch techniques.

Thus, a method of forming MTJ elements with high precision and minimized damage has been described herein in detail. Some fine point details that are well known in the art might not have been mentioned here for sake of not obscuring the more important concepts of this disclosure. With the above description, those skilled in the art can thoroughly understand how to implement the technique solutions disclosed herein.

Although specific embodiments in accordance with the present disclosure have been demonstrated in detail, it should be understood by persons skilled in the art and in light of the foregoing that the above examples are only intended to be illustrative but not to limit the scope of the present teachings. It should be understood by a person skilled in the art that the above embodiments can be modified without departing from the scope and spirit of the present disclosure.

What is claimed is:

1. A method of fabricating a miniaturized device so that it contains one or more MTJ elements, the method comprising:
    providing a substrate;
    forming on the substrate, one or more landing pads for the to-be-formed MTJ elements;
    depositing on the substrate having the one or more landing pads, a magnetic tunnel junction precursor layer having one or more ferromagnetic and/or anti-ferromagnetic sublayers;
    depositing on the magnetic tunnel junction precursor layer, a sacrificial dielectric layer;
    patterning the deposited sacrificial dielectric layer so as to form therein one or more patterned recesses, each aligning over a respective one of the one or more landing pads and each extending down to expose a corresponding part of the magnetic tunnel junction precursor layer;
    depositing into the recesses, one or more conductive materials that can function as an etch mask for a subsequent etching of the magnetic tunnel junction precursor layer;
    after the one or more conductive and etch mask forming materials are deposited in the recesses, selectively removing the sacrificial dielectric layer; and
    after the sacrificial dielectric layer is removed, patterning the magnetic tunnel junction precursor layer by etching it while the one or more conductive and etch mask forming materials function as an etch mask for the etching so as to thereby form the one or more magnetic tunnel junction elements.

2. The method of claim 1 wherein, in addition to forming the one or more landing pads in a first portion of the substrate, the method includes simultaneously forming one or more interconnect pads in a spaced apart second portion of the substrate.

3. The method of claim 2 wherein, said depositing of the magnetic tunnel junction precursor layer includes depositing it over the second portion of the substrate having the one or more interconnect pads.

4. The method according to claim 3, and further comprising:
    after the one or more landing pads and the one or more connection pads are formed on the substrate, performing a planarization process that planarizes and creates co-planarity for top surfaces of the one or more landing pads and the one or more connection pads.

5. The method of claim 2, wherein said depositing of the magnetic tunnel junction precursor layer comprises:
    for each landing pad, forming a corresponding separation part covering the respective landing pad;
    after the separation parts are formed, forming a separation dielectric layer to cover exposed parts of the substrate and exposed ones of the one or more connection pads; and
    after the separation dielectric layer is formed, performing a planarization process that co-planarizes top surfaces of the formed separation parts and of the separation dielectric layer; and
    wherein said depositing of the magnetic tunnel junction precursor layer in on the co-planarized top surfaces of the separation parts and of the separation dielectric layer.

6. The method according to claim 5, wherein forming the separation parts each covering a respective one of the landing pads comprises:
    depositing a separation layer on the substrate having the landing pads and the connection pads;
    coating photoresist on the separation layer;

patterning the coated photoresist to form separate islands each covering a respective one of the plurality of landing pads; and performing reactive ion etching to thereby leave behind individualized separation parts corresponding to the separation islands.

7. The method of claim 1, wherein each of the landing pads comprises Cu.

8. The method according to claim 2, wherein the forming of the landing pads and of the connection pads comprises:

forming a plurality of pad receiving openings in the substrate;

forming a first diffusion barrier layer on the bottom walls and sidewalls of each of the plurality of pad receiving openings; and depositing into the first diffusion barrier layer covered ones of the pad receiving openings, a metal forming the landing pads and the connection pads.

9. The method of claim 1, wherein the substrate includes a low-K dielectric material having a low dielectric constant or a super low dielectric constant.

10. The method of claim 1, wherein the substrate comprises a silicon oxide.

11. The method of claim 1, wherein the magnetic tunnel junction precursor layer includes at least one of cobalt-iron and nickel-iron as a ferromagnetic component thereof.

12. The method of claim 1, wherein the sacrificial dielectric layer is a Si rich Si-bottom anti-reflective coating (Si-BARC), wherein Si content exceeds 30% volume.

13. The method of claim 1, wherein forming a plurality of openings in the sacrificial dielectric layer comprises:

coating photoresist on the sacrificial dielectric layer;

patterning the coated photoresist to form a plurality of photoresist openings each corresponding to a respective one of the plurality of landing pads; and performing a reactive ion etching process to form a plurality of openings in the sacrificial dielectric layer corresponding to the plurality of landing pads.

14. The method of claim 1, wherein the metal mask layer is made of a metal that is substantially insusceptible to the etching process used for defining the MTJ elements.

15. The method of claim 14, wherein the metal mask layer is made of Cu.

16. The method according to claim 15, wherein depositing the metal mask layer in the plurality of openings through plating comprises:

forming a second diffusion barrier layer on the bottom and sidewalls of each of the plurality of pad openings;

growing a metal mask seed layer on the second diffusion barrier layer; and depositing Cu on the metal mask seed layer through plating to form the metal mask layer.

17. The method according to claim 1, wherein selectively removing the consumed (sacrificial) dielectric layer comprises:

removing the consumed dielectric layer through at least one of a wet etching process and a combination of wet etching and ashing.

18. The method according to claim 1, wherein after the plurality of magnetic tunnel junction elements are formed, an intermediate dielectric layer is deposited, and then a planarization process is carried out to planarize surfaces of the intermediate dielectric layer and the metal mask layer.

19. The method according to claim 18, further comprising forming a metal interconnect layer that electrically connects to one or more of the connection pads, and wherein the forming of a metal interconnect layer comprises:

forming a plurality of vias through the intermediate dielectric layer;

performing a etching process to further form in the intermediate dielectric layer a plurality of trenches connected to the plurality of vias in the intermediate dielectric layer;

forming a third diffusion barrier layer on sidewalls of the plurality of vias and of the plurality of trenches; and depositing a metal connection layer on the third diffusion barrier layer to fill the plurality of vias and the plurality of trenches.

20. The method according to claim 18, wherein after the metal interconnect layer is deposited, a planarization process is performed to planarize surfaces of the metal interconnect layer, the intermediate dielectric layer and the metal mask layer.

* * * * *